US006636121B2

(12) United States Patent
Barak et al.

(10) Patent No.: US 6,636,121 B2
(45) Date of Patent: Oct. 21, 2003

(54) METHOD FOR ESTIMATING CRYSTAL COEFFICIENT VALUES FOR A SIGNAL GENERATOR

(75) Inventors: Ilan Barak, Kfar Saba (IL); Dimitry Petrov, Beit-Shemesh (IL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/867,571

(22) Filed: May 31, 2001

(65) Prior Publication Data

US 2002/0180535 A1 Dec. 5, 2002

(51) Int. Cl.[7] .............. H03L 7/00; H03B 5/32
(52) U.S. Cl. .............. 331/25; 331/158; 331/66; 331/176
(58) Field of Search .............. 331/25, 66, 176, 331/158, 116 R

(56) References Cited

U.S. PATENT DOCUMENTS

| 5,392,005 A | | 2/1995 | Bortolini et al. |
| 5,740,525 A | | 4/1998 | Spears |
| 5,790,412 A | | 8/1998 | Su |
| 6,166,608 A | * | 12/2000 | Merriss et al. .............. 331/158 |
| 6,472,943 B1 | * | 10/2002 | Soong et al. .............. 331/44 |

FOREIGN PATENT DOCUMENTS

EP          0834994 A1    4/1998

* cited by examiner

Primary Examiner—Robert Pascal
Assistant Examiner—Kimberly E Glenn
(74) Attorney, Agent, or Firm—Eitan, Pearl, Latzer & Cohen Zedek, LLP

(57) ABSTRACT

Based on an initial crystal coefficient value, a processor generates a control signal for a frequency synthesizer. The processor estimates a new crystal coefficient value based on a comparison of the frequency of the output of the frequency synthesizer against a target output frequency in relation to a crystal temperature value.

30 Claims, 3 Drawing Sheets

METHOD FOR ESTIMATING CRYSTAL COEFFICIENT VALUES FOR A SIGNAL GENERATOR

FIELD OF THE INVENTION

The present invention relates generally to radio communication devices, and specifically to crystal based devices and methods for accurate frequency control of radio transceivers.

BACKGROUND

Crystal oscillators (XOs), which are often used in frequency control on radio transceivers and other applications, are not in and of themselves sufficiently stable to provide an accurate and consistent source signal. The inherent frequency of a crystal oscillator is known to vary with temperature and also to change gradually as the crystal ages. Because of these shortcomings of ordinary crystal oscillators, transceivers known in the art generally use either a temperature-compensated crystal oscillator (TCXO) or a voltage-controlled TCXO (VCTCXO) as a precise frequency reference source. TCXO, and VCTCXOs, however, are larger and more expensive than simple crystal oscillators.

Systems and methods are known which derive control parameters, such as divider values, for a conventional synthesizer from the synthesizer's crystal coefficient values and from its temperature. These systems are able to obtain from a frequency synthesizer using a conventional crystal oscillator frequency accuracy comparable to that of TCXOs or VCTCXOs based synthesizers. More specifically, these systems take into account that the output frequency of an XO equals a nominal output frequency ($f_0$) $_{plus\ \Delta fCr}$ which may be calculated in accordance with the formula below:

$$\Delta f_{Cr}\ [ppm]=d+c^*t_x+b^*t_x^2+a^*t_x^3$$

where: $t_x$ is equal to the actual temperature ($T_{actual}$) minus the nominal crystal constant ($T_{nominal}$), the crystal coefficients (d, c, b, and a) are specific to the crystal, and $\Delta f_{Cr}$ [ppm] represents frequency deviation in parts per million.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
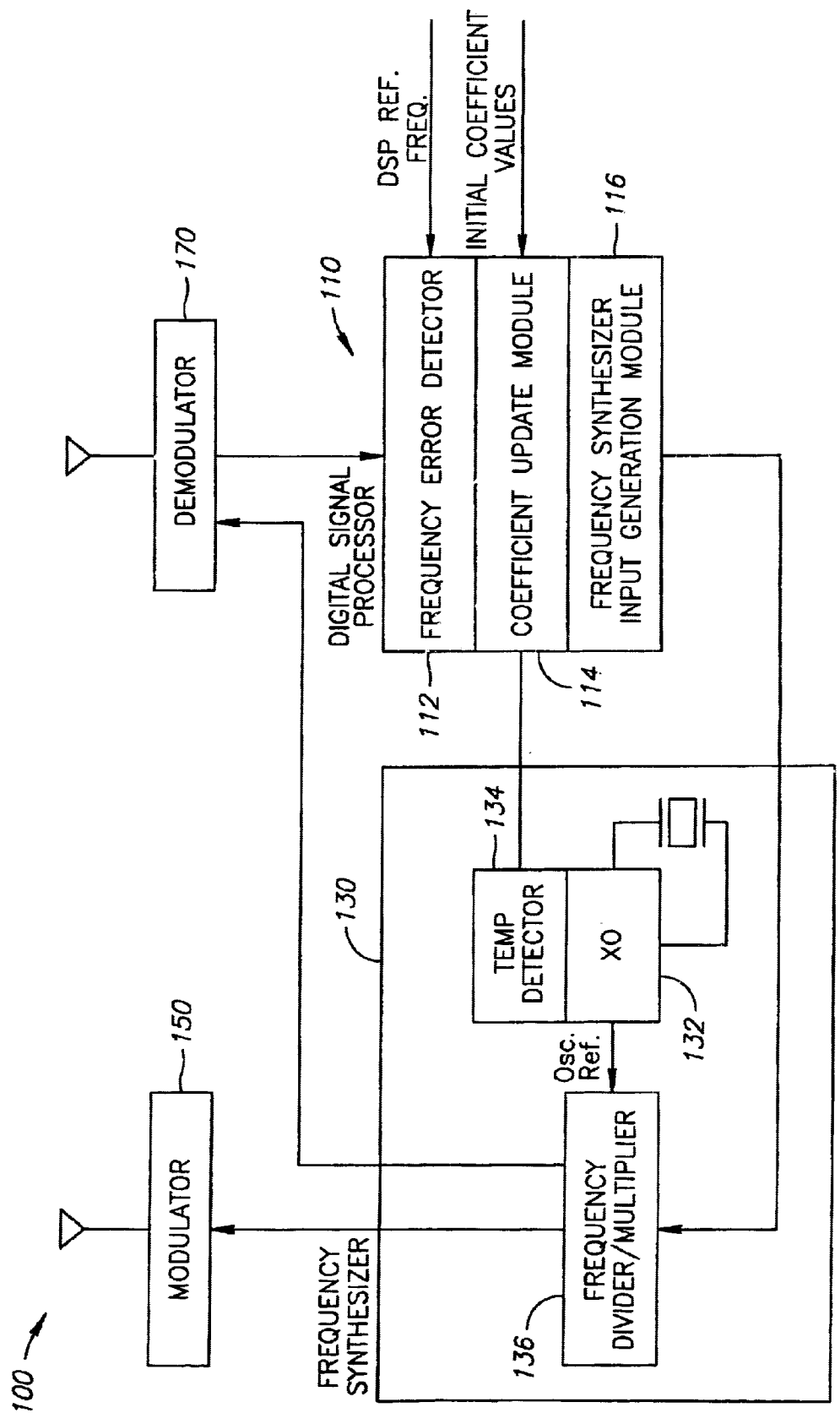
FIG. 1 is a block diagram showing transceiver capable of deriving a crystal's coefficient values according to the present invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Unless specifically stated otherwise, as apparent from the following discussions, it is appreciated that throughout the specification discussions utilizing terms such as "processing", "computing", "calculating", "determining", or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing systems memories, registers or other such information storage, transmission or display devices.

Embodiments of the present invention may include apparatuses for performing the operations herein. This apparatus may be specially constructed for the desired purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, magnetic-optical disks, read-only memories (ROMs), random access memories (RAMs) electrically programmable read-only memories (EPROMs), electrically erasable and programmable read only memories (EEPROMs), magnetic or optical cards, or any other type of media suitable for storing electronic instructions, and capable of being coupled to a computer system bus.

The processes and displays presented herein are not inherently related to any particular computer or other apparatus. Various general purpose systems may be used with programs in accordance with the teachings herein, or it may prove convenient to construct a more specialized apparatus to perform the desired method. The desired structure for a variety of these systems will appear from the description below. In addition, embodiments of the present invention are not described with reference to any particular programming language. It will be appreciated that a variety of programming languages may be used to implement the teachings of the inventions as described herein.

As part of the present invention, based on assumed initial crystal coefficient values, a crystal temperature value, and a target frequency value, a processor produces a control signal intended to cause a frequency synthesizer or signal generator to produce a signal at the target frequency. The output of the frequency synthesizer is evaluated to determine the difference between the actual frequency of the output and the target output frequency; this difference is denoted the frequency error. The processor recalculates or re-estimates the assumed crystal coefficient values based on the detected frequency error and temperature and produces another signal intended to cause the frequency synthesizer to produce a signal at the desired target frequency. The crystal coefficient values are recalculated until the frequency error is below a threshold value.

Turning now to FIG. 1, as part of an embodiment in accordance with the present invention there is shown a transceiver 100 having a modulator 150 and demodulator 170 receiving a signal from a frequency synthesizer (signal generator) 130. The frequency synthesizer 130 having a crystal oscillator 132 supplying a reference signal to a frequency divider/multiplier 136 and being thermally coupled to a temperature detector 134.

The transceiver 100 also includes a digital signal processor ("DSP") 110 or functionally similar computing device. The DSP having a frequency error detector 112, a coefficient update module 114 and a frequency synthesizer input generation module 116.

Figure 2:
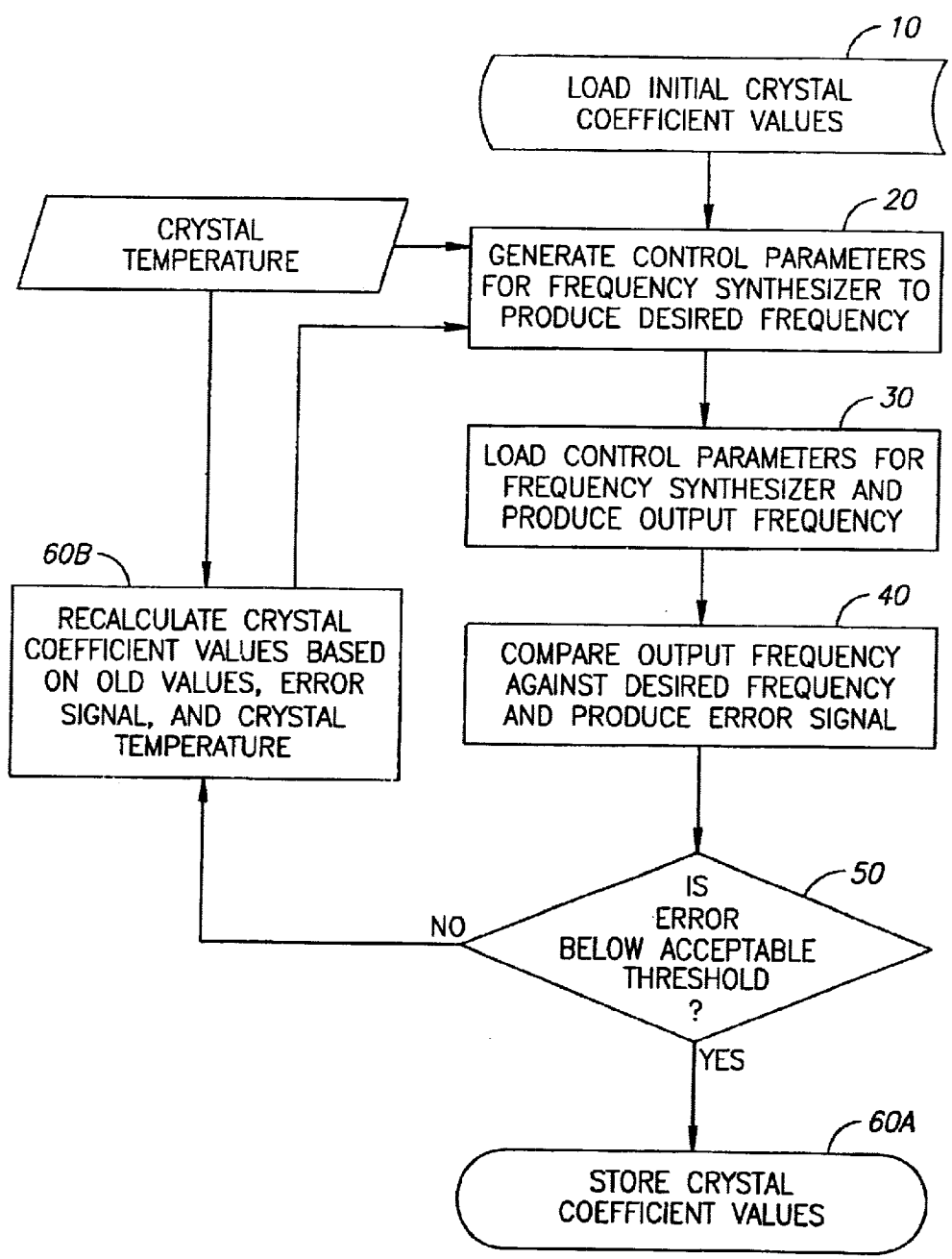
FIG. 2 is a flow diagram showing the steps of an iterative method for deriving a crystal's coefficient values according to the present invention.

Turning now to FIG. 2, there is shown a flow diagram listing the steps of a method by which a crystal's coefficient values may be derived according to the present invention. As part of the first (Step 10), initial crystal coefficient values are loaded into the DSP 110, specifically the initial crystal coefficient values are loaded into the coefficient update module 114 of the DSP 110. The initial coefficient values, which are usually provided by the crystal manufacturer as "nominal coefficient values", are only estimations of the crystal's actual coefficient values. The crystal's actual coefficient values often differ substantially from the nominal coefficient value. Based on the initial coefficient values, control parameters for the frequency synthesizer 130 are generated (Step 20). The control parameters, which may include one or more values to be uploaded into a register of the frequency divider/multiplier 136, are calculated so as to cause the frequency synthesizer 130 to produce a desired frequency, for example the frequency of a signal being received by the demodulator 170.

Once the parameters are calculated, they are uploaded (Step 30) to the frequency divider/multiplier 136. The frequency divider/multiplier 136 receives a reference signal from the crystal oscillator 132 and based on the uploaded parameters converts the reference signal to an output signal having an actual output frequency. The actual frequency of the output signal may be compared against the frequency of the desired output (Step 40) in one of several ways. The frequency error detector 112 may compare the direct output of the frequency synthesizer 130 against an external reference signal. Alternatively, the error detector 112 may compare the frequency of a signal which has been received, down converted using the synthesizer's 130 output signal against an independent reference signal source such as a signal derived from the DSP clock. Determining signal frequency and signal frequency error is well known, and any such method is suitable to the present invention.

A decision of whether or not the detected frequency error is within some threshold limit is made as part of Step 50. For example, modern cellular networks use tolerances from 3 to 0.2 parts per million. If the detected frequency error is within the acceptable limits, the crystal coefficient values upon which the parameters were based are stored (Step 60a) as the crystal's actual coefficient values. However, if the frequency error is beyond predefined limits, there is a recalculation of the coefficients performed by the coefficient update module 114. New coefficients are calculated based on the previous coefficient values, the frequency error, and based on the crystal's temperature (step 60)b). The following is an example of an algorithm for calculating new coefficients:

Adaptive "c" and "d" coefficients correction uses measured frequency error. The solution for optimum coefficient vector is usually obtained by an iterative procedure. One is the method of steepest descent, in which initial values for coefficient [c(0),d(0)] vector are chosen.

The first "d" coefficient d(0) may first be estimated by the following equation:

$$d(0)=(F-a*(T_{actual}-T_0)^3-b*(T_{actual}-T_0)^2-c*(T_{actual}-T_0)) \quad \text{Equation 1}$$

where:
$T_{actual}$—actual calibration temperature measured on crystal;
F—measured crystal oscillator frequency at $T_{actual}$;
$T_0$—Nominal transition point (28.9 degrees C.); and
a, b, c—Nominal polynomial coefficients.

In accordance with the crystal polynomial properties, the temperature range of interest is divided in two parts: one for "d" coefficient estimation and second one for "c" coefficient estimation. This is to avoid explicit computation for "c" and "d" coefficients simultaneously. Moreover, it has been simulated that the "a" and "b" coefficients' variance impose a negligible frequency error, that could be compensated partially in the "c" and "d" estimated values. However, a similar algorithm could be applied for "a" and "b" coefficients estimation.

For temperature ranges where $|T_{actual}-T_0|<k_d$, (a given temperature range for the "d" coefficient), a gradient vector ($g_{d(m)}$) as defined in Equation 2, is then computed.

$$g_{d(m)}=d(m)-10^{\wedge}6*(F_{actual}(m+1)-F_{required})/(f_{Cr0}*N), \quad \text{Equation 2}$$

Where:
$k_d$—crystal dependent temperature range for "d" coefficient calibration;
$f_{Cr0}$—Nominal crystal frequency, 28.8*10^6 [Hz] for present invention;
$F_{actual}(m+1)-F_{required}$—frequency error measured in $m^{th}$ iteration [Hz]
N—coefficient corresponding to the PLL frequency division ratio.

Then "d" coefficient is changed in a direction opposite to its corresponding gradient. The change in the coefficient is proportional to the size of the gradient coefficient, and may be calculated using Equation 3.

$$d(m+1)=d(m)-dff*g_{d(m)} \quad \text{Equation 3}$$

Where:
m—iteration number;
$f_{Cr0}$—Nominal crystal frequency, 28.8*10^6 [Hz]; and
dff—parameter for iterative procedure.

To ensure convergence of the iterative procedure "dff" is chosen to be a small positive number. However, "dff" may also be dynamically adjusted in positive correlation to the size of the measured signal error.

When $|T_{actual}-T_0|>k_c$, gradient the "c" coefficient may be updated using an analogous procedure as for the "d" coefficient. However, c(0) is usually given by the crystal provider.

$$g_{c(m)}=c(m)-10^{\wedge}6*(F_{actual}(m+1)-F_{required})/(f_{Cr0}*N*(T_{actual(m+1)}-T_0)) \quad \text{Equation 4}$$

$$c(m+1)=c(m)-cff*g_{c(m)} \quad \text{Equation 5}$$

Where:
$k_c$—crystal dependent temperature range for "c" coefficient calibration;
$f_{Cr0}$—Nominal crystal frequency, 28.8*10^6 [Hz] for present invention;
$F_{actual}(m+1)-F_{required}$—frequency error measured in the $m^{th}$ iteration [Hz];

N—coefficient corresponding to the PLL frequency division ratio;
cff—parameter for iterative procedure; and
m—iteration number.

Once new coefficient values are calculated (Step 60b) by the coefficient update module 114, the values are used by the frequency synthesizer input generation module 116 to calculate new control parameters for the frequency synthesizer 130 (Step 20). Steps 20 through 60b are repeated until the detected frequency error falls within acceptable limits and then the coefficient values are stored as part of Step 60a.

Figure 3:
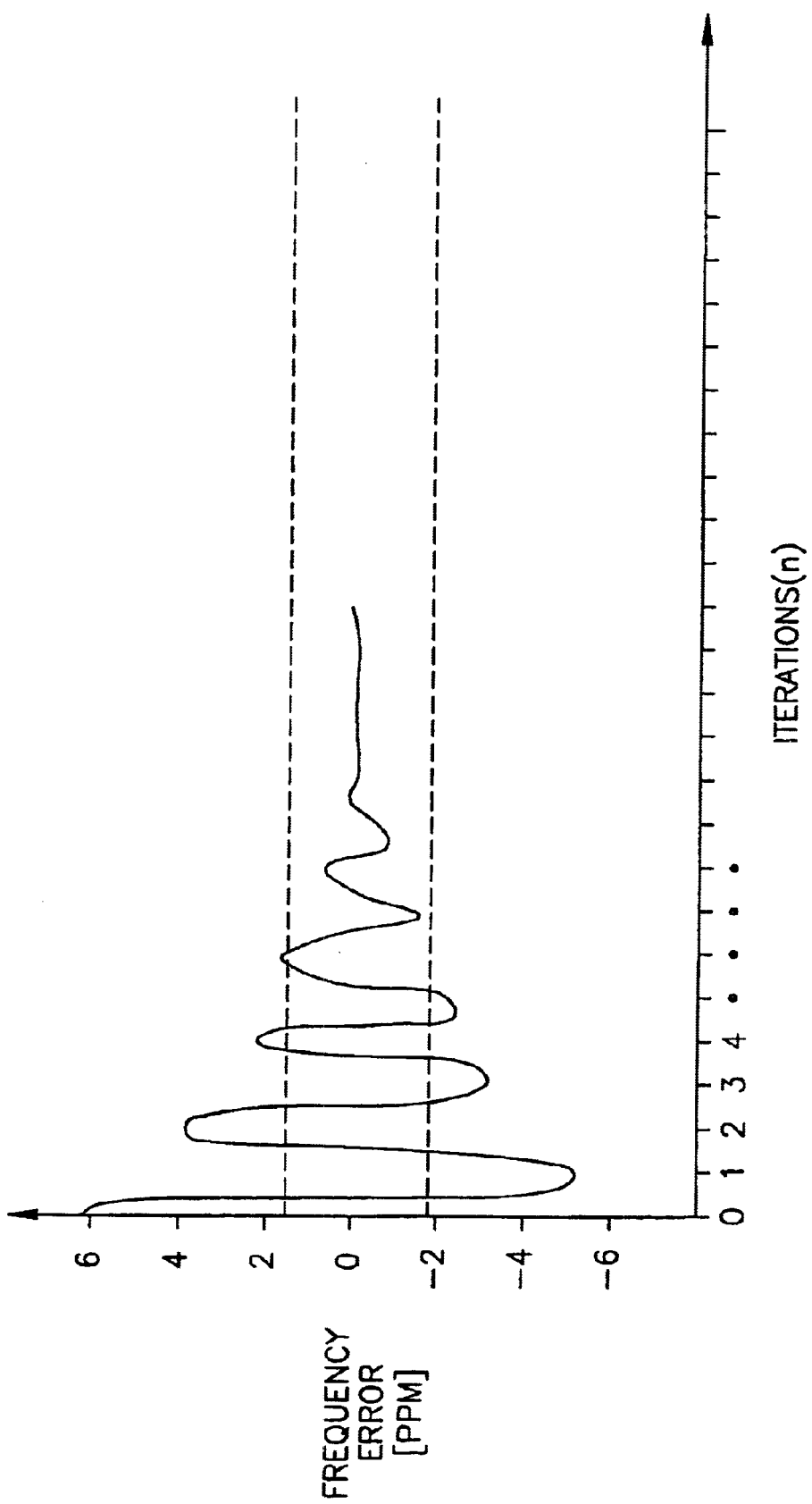
FIG. 3 is a graph showing variations in the output frequency over multiple iterations of the method of FIG. 2.

Turning now to FIG. 3, there is a graph of the resulting change in the frequency of the output of an exemplary frequency synthesizer using a conventional crystal oscillator for whom the crystal coefficient values are being recalculated according to steps of FIG. 2. As Steps 20 through 60b are repeated and the crystal's coefficients are recalculated, the resulting output frequency from the frequency synthesizer converges to the targeted frequency and the frequency error may decrease with each iteration, While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed:

1. A method comprising estimating a temperature coefficient value of a crystal functionally associated with a frequency synthesizer in relation to an error signal based on at least partial comparison between an output of the frequency synthesizer and a reference frequency signal of a processor associated with the frequency synthesizer.

2. The method according to claim 1, comprising generating a frequency synthesizer control signal correlated to the reference frequency signal.

3. The method according to claim 2, comprising adjusting the frequency synthesizer control signal in relation to the temperature coefficient value.

4. The method according to claim 1, wherein estimating a temperature coefficient value comprises factoring a crystal temperature value into the temperature coefficient value.

5. The method according to claim 4, comprising estimating a plurality of temperature coefficient values relating to said crystal based on said error signal and said crystal temperature value.

6. The method according to claim 1, comprising repeatedly updating the temperature coefficient value until the error signal falls below a predefined threshold value.

7. The method according to claim 6, comprising adjusting the synthesizer control signal each time the temperature coefficient value is updated.

8. A signal generator comprising:
a frequency synthesizer comprising a crystal oscillator to generate an output frequency;
a frequency error detector operatively connected to said crystal oscillator to provide an error signal responsive to an error of said output frequency relative to an independent reference frequency of the signal generator; and
a processing unit operatively associated with said crystal oscillator and said frequency error detector, said processing unit adapted to store a first value of a temperature coefficient and adapted to estimate a second value of said temperature coefficient in response to said error signal.

9. The signal generator according to claim 8, wherein said processing unit generates a frequency synthesizer control signal correlated to said independent reference target frequency value.

10. The signal generator according to claim 9, further comprising a temperature measurement unit operatively coupled to said crystal oscillator.

11. The signal generator according to claim 10, wherein said processing unit estimates the second value of said temperature coefficient at least partially based on an output from said temperature measurement unit.

12. The signal generator according to claim 11, wherein said processing unit regenerates a new frequency synthesizer control signal correlated to said independent reference target frequency value after estimating the second value of said temperature coefficient.

13. The signal generator according to claim 12, wherein said processing unit is adapted to store first values of a plurality of temperature coefficients and to estimate second values of said plurality of temperature coefficients in response to said error signal.

14. The signal generator according to claim 12, wherein said processing unit is adapted to repeatedly estimate new temperature coefficient values and to regenerate new frequency synthesizer control signals until said error signal indicates a frequency error below a predefined threshold.

15. An article comprising a storage medium having stored thereon instructions, that, when executed by a computing platform, cause the computing platform to estimate a temperature coefficient value relating to a crystal oscillator of a frequency synthesizer, said temperature coefficient value being estimated at least partially based on an error signal responsive to a frequency error between an output frequency of said frequency synthesizer and a reference frequency signal of a processor associated with the frequency synthesizer.

16. The article of claim 15, comprising instructions that, when executed, cause the platform to factor a crystal temperature value into the temperature coefficient value.

17. The article of claim 16, further comprising instructions that, when executed, cause the platform to generate a control signal to said frequency synthesizer.

18. The article of claim 17, further comprising instructions that, when executed, cause said control signal to be calculated to cause said frequency synthesizer to produce a signal at the independent reference target frequency value.

19. The article of claim 18, further comprising instructions that, when executed, cause the platform to repeat estimating a temperature coefficient value and generating a control signal until the error signal is below a predetermined level.

20. A method comprising:
generating a frequency synthesizer control signal correlated to a target frequency; and
estimating a temperature coefficient value of a crystal functionally associated with a frequency synthesizer in relation to an error signal based on at least partial comparison between an output of the frequency synthesizer and the target frequency,
wherein estimating a temperature coefficient value comprises factoring a crystal temperature value into an estimation of the temperature coefficient value and into the synthesizer control signal.

21. The method according to claim 20, further comprising adjusting the frequency synthesizer control signal in relation to the estimated temperature coefficient value.

22. The method according to claim 20, further comprising repeatedly updating the estimated temperature coefficient value until the error signal falls below a predefined threshold value.

23. The method according to claim 22, further comprising adjusting the synthesizer control signal each time the estimated temperature coefficient value is updated.

24. The method according to claim 23, comprising estimating a plurality of temperature coefficient values relating to said crystal based on said error signal and said crystal temperature value.

25. A signal generator comprising:
   a frequency synthesizer comprising a crystal oscillator;
   a frequency error detector operatively connected to said crystal oscillator;
   a processing unit operatively associated with said crystal oscillator and said frequency error detector, said processing unit adapted to store a first value of a temperature coefficient and adapted to estimate a second value of said temperature coefficient in relation to output from said frequency error detector,
   wherein said processing unit generates a frequency synthesizer control signal correlated to a target frequency; and
   a temperature measurement unit operatively coupled to said crystal oscillator.

26. The signal generator according to claim 25, wherein said processing unit estimates the second value of said temperature coefficient at least partially based on an output from said temperature measurement unit.

27. The signal generator according to claim 26, wherein said processing unit regenerates a new frequency synthesizer control signal correlated to said target frequency after estimating the second value of said temperature coefficient.

28. The signal generator according to claim 27, wherein said processing unit is adapted to store first values of a plurality of temperature coefficients and to estimate second values of said plurality of temperature coefficients in relation to the output from said frequency error detector.

29. The signal generator according to claim 27, wherein said processing unit is adapted to repeatedly estimate new temperature coefficient values and to regenerate new frequency synthesizer control signals until the output from said frequency error detector indicates a frequency error below a predefined threshold.

30. An article comprising a storage medium having stored thereon instructions, that, when executed by a computing platform, cause the computing platform to:
   estimate a temperature coefficient value relating to a crystal oscillator of a frequency synthesizer, said temperature coefficient value being estimated at least partially based on input from a frequency error detector;
   factor in a crystal temperature;
   generate a control signal to said frequency synthesizer;
   cause said control signal to be calculated to cause said frequency synthesizer to produce a signal at a target frequency; and
   repeat estimating a temperature coefficient value and generating a control signal until the input from said frequency detector indicates a signal error below a predetermined level.

* * * * *

UNITED STATES PATENT AND TRADEMARK OFFICE
CERTIFICATE OF CORRECTION

PATENT NO.    : 6,636,121 B2
DATED         : October 21, 2003
INVENTOR(S)   : Barak, Ilan et al.

It is certified that error appears in the above-identified patent and that said Letters Patent is hereby corrected as shown below:

<u>Title page,</u>
Item [75], Inventors, please replace "Dimitry Petrov" with -- Dmitry Petrov --.

Signed and Sealed this

Thirtieth Day of December, 2003

JAMES E. ROGAN
*Director of the United States Patent and Trademark Office*